United States Patent [19]

Li

[11] Patent Number: 4,709,170

[45] Date of Patent: Nov. 24, 1987

[54] SUBNANOSECOND PROGRAMMABLE PHASE SHIFTER FOR A HIGH FREQUENCY DIGITAL PLL

[75] Inventor: Gabriel M. Y. Li, San Francisco, Calif.

[73] Assignee: National Semiconductor Corp., Santa Clara, Calif.

[21] Appl. No.: 932,952

[22] Filed: Nov. 19, 1986

Related U.S. Application Data

[63] Continuation of Ser. No. 642,232, Aug. 20, 1984.

[51] Int. Cl.⁴ ........................ H03K 5/18; H03K 13/175
[52] U.S. Cl. ........................................ 307/511; 307/479; 307/262; 328/24; 328/55; 328/109
[58] Field of Search .............. 307/479, 511, 262, 320, 307/605, 254; 328/24, 55, 109

[56] References Cited

U.S. PATENT DOCUMENTS

| | | | |
|---|---|---|---|
| 3,568,077 | 3/1971 | Fujimoto | 328/155 |
| 3,601,708 | 8/1971 | Stempler et al. | 328/155 |
| 3,622,914 | 11/1971 | Chung | 332/30 V |
| 4,019,152 | 4/1977 | Hardwood et al. | 307/320 |
| 4,080,574 | 3/1978 | Loosemore et al. | 328/109 |
| 4,533,903 | 8/1985 | Yamada et al. | 307/361 |

OTHER PUBLICATIONS

"High-Frequency CMOS Continuous-Time Filters" by Paul R. Gray and Haideh Khorramabadi, IEEE Journal of Solid-State Circuits, vol. SC-19, No. 6, 12-84.

Primary Examiner—Stanley D. Miller
Assistant Examiner—Richard Roseen
Attorney, Agent, or Firm—Gail W. Woodward

[57] ABSTRACT

A circuit for producing a programmable phase shift of clock pulses in response to the data on a group of control lines. The circuit includes a ramp generator stage coupled to drive a comparator stage which has a reference potential input determined by the control line data. The phase shift can be employed to produce a series of subnanosecond delay increments on the clock pulses and is useful in the fine adjustment of a digital phase lock loop.

6 Claims, 6 Drawing Figures

Fig_1

DIGITAL CONTROL LINES

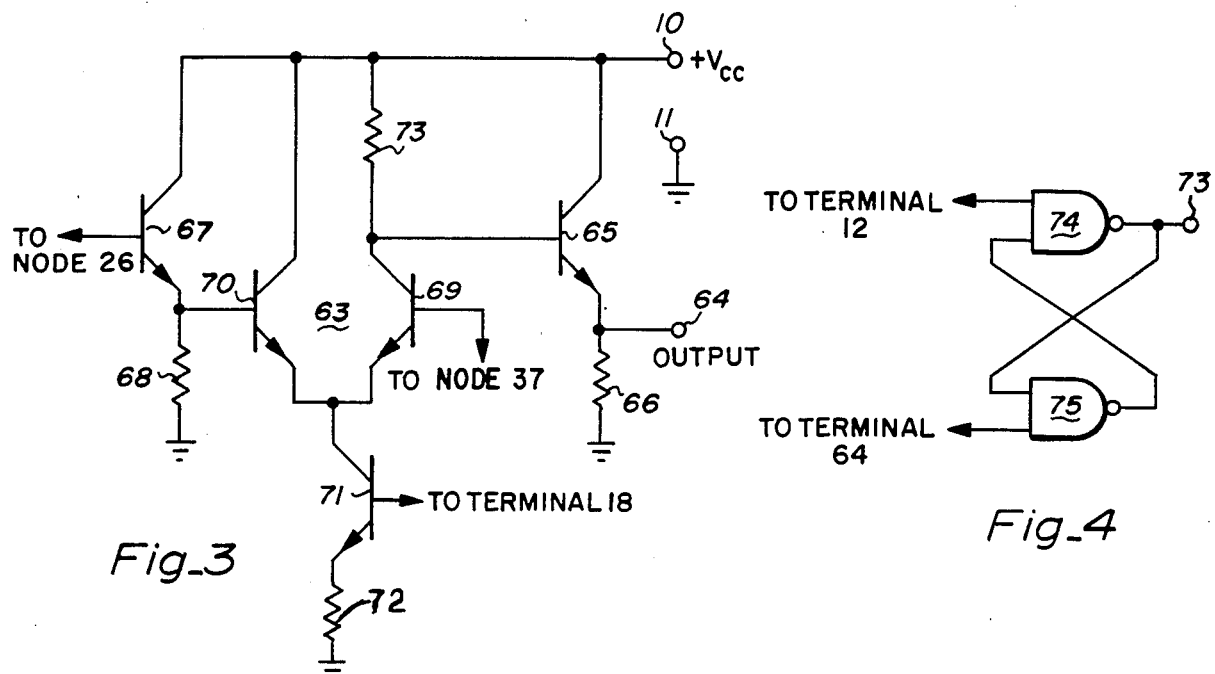
Fig_3    Fig_4
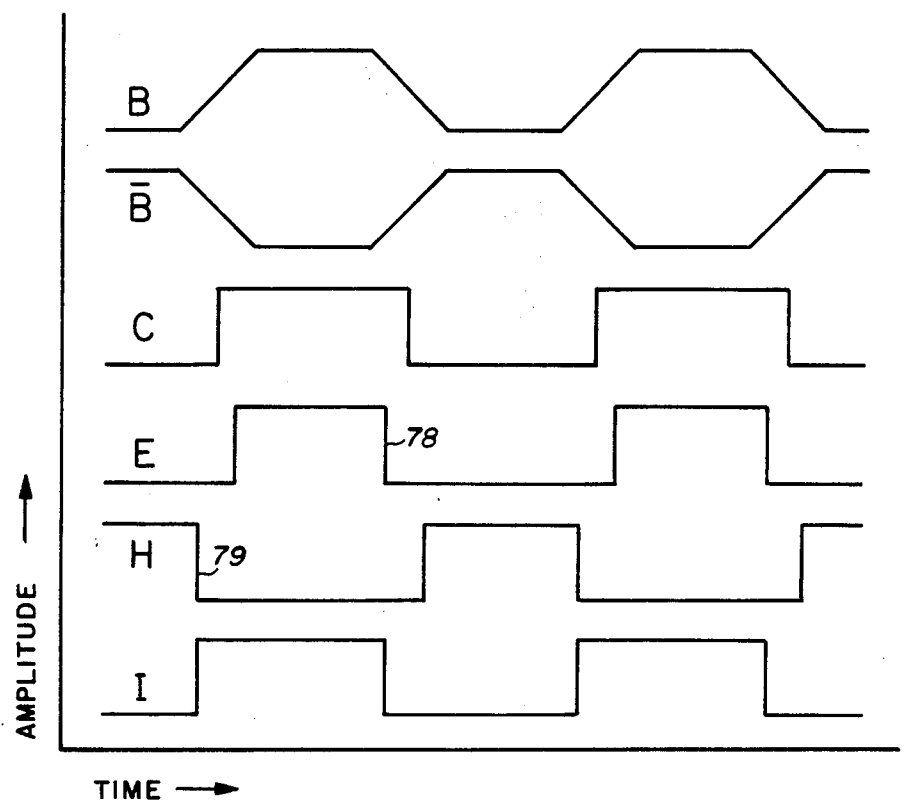
Fig_6

SUBNANOSECOND PROGRAMMABLE PHASE SHIFTER FOR A HIGH FREQUENCY DIGITAL PLL

This is a continuation of co-pending application 642,232, filed on Aug. 20, 1984.

BACKGROUND OF THE INVENTION

Phase lock loop (PLL) technology has proven to be extremely useful in analog electronic circuits and its application to digital circuits is attractive and growing. In a copending application Ser. No. 550,526 filed Nov. 9, 1983. A DIGITAL PLL DECODER is described in connection with a communications system. The application, which is assigned to the assignee of the present invention, is incorporated herein by reference. A multi-phase clock source develops a plurality of clock signals which have phase-offset characteristics. When a comparison of the receiver clock with the received clock signal shows an offset, the clock phase is changed to another clock phase to minimize the offset. Thus, the receiver clock is effectively synchronized with the received signal (transmitter) clock. By performing the locking with digital signals the receiver does not require precision external components. This system is effective in receiver clock locking and it is fully capable of phase locking to the accuracy required in most communications systems it operates. It would be helpful to incorporate a vernier phase shifter for the clock pulses to increase the phase lock accuracy.

SUMMARY OF THE INVENTION

It is an object of the invention to provide a circuit in which clock pulses can be phase shifted in subnanosecond increments in response to a digital control input.

It is a further object of the invention to digitally shift the phase of clock pulses in small steps and to provide a clock signal having a fifty percent (50%) duty cycle.

These and other objects are achieved in a circuit configured as follows. Clock pulses are applied to an integrator stage which introduces ramps at the leading and trailing edges of the clock pulses. The ramped signal is applied to a comparator having a variable threshold that is determined by a digitally responsive current. The output of the comparator is a pulse having an edge that is shifted with respect to the input by an increment that is determined by the digitally responsive current. The pulse edge can be either advanced or retarded with respect to a nominal position.

In the event that a fifty percent (50%) pulse duty cycle is required a second comparator is incorporated into the circuit and driven complementarily in relation to the first comparator. The same comparator reference is employed. The two comparators are coupled to an RS latch which then provides a symmetrical pulse output having a fifty percent (50%) duty cycle.

BRIEF DESCRIPTION OF THE DRAWING

FIG. 3 is a schematic diagram of a second comparator with complementary input relative to the first comparator of FIG. 1.

FIG. 4 is a logic diagram that works with the FIG. 3 circuit to provide a 50% duty cycle output pulse.

FIG. 6 is a graph showing the waveforms associated with the circuits of FIGS. 1, 3 and 4 for the condition of a high $V_{REF}$.

DESCRIPTION OF THE INVENTION

Figure 1:
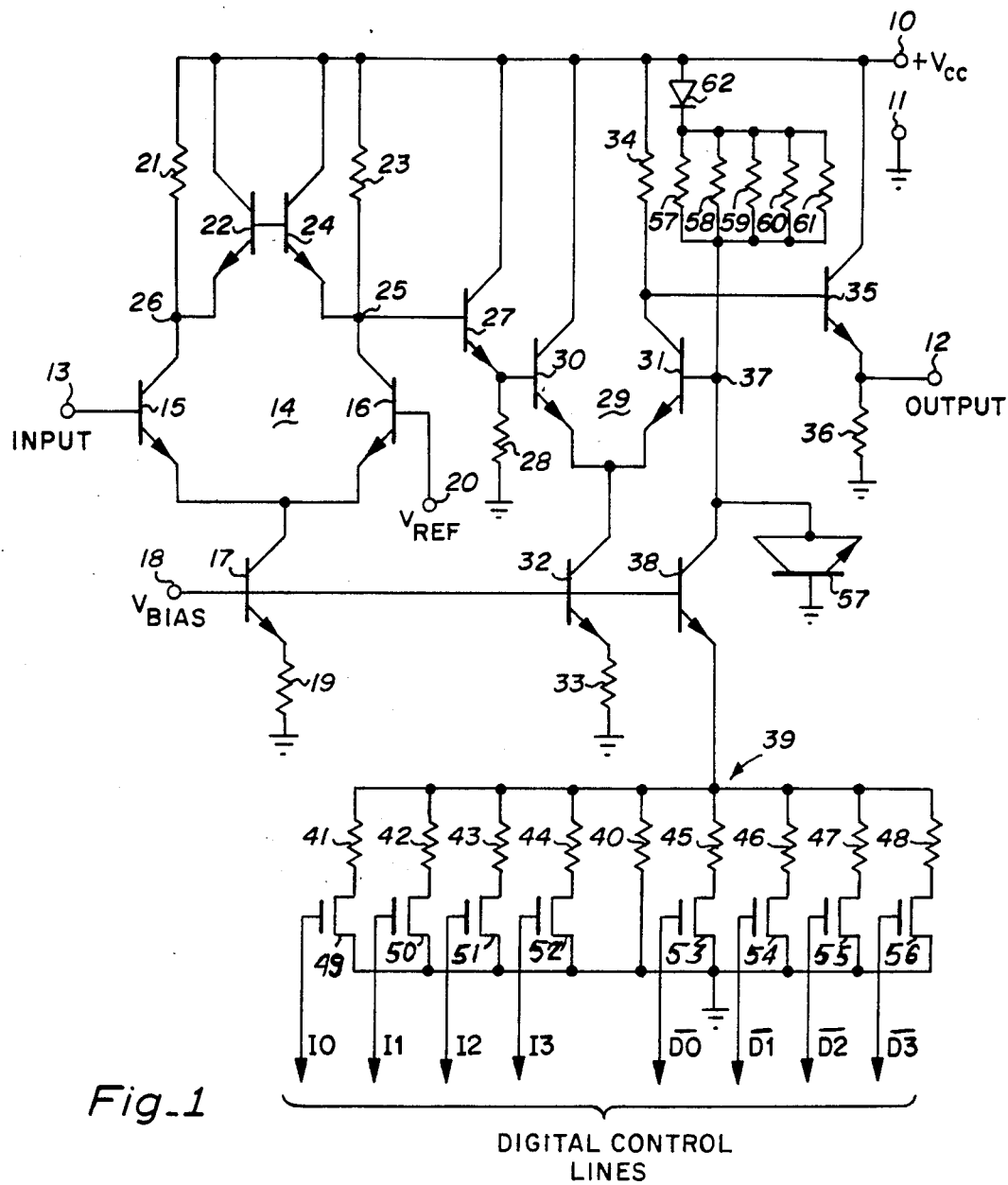
FIG. 1 is a schematic diagram of the circuit of the invention.

The circuit of FIG. 1 operates from a $V_{CC}$ power supply connected + to terminal 10 and − to ground terminal 11. Typically $V_{CC}$ is the nominal 5 volts associated with TLL circuitry. The output at terminal 12 is a phase shifted clock pulse train. The input at termial 13 is the system clock pulse train.

The heart of the circuit is ramp generator 14. Transistors 15 and 16 are differentially connected with transistor 17 providing the tail current. The base of transistor 17 is returned to a source of bias at terminal 18 and is typically operated at $2V_{BE}$ above ground. Transistor 17 in conjunction with resistor 19 provides a tail current of about 500 amperes. The base of transistor 16 is returned to a source of reference voltage at terminal 20 which is typically operated at about 2.5 $V_{BE}$ below $V_{CC}$.

The collector of transistor 15 is returned to $+V_{CC}$ by way of resistor 21 in parallel with transistor 22. The collector of transistor 16 is returned to $+V_{CC}$ by way of resistor 33 in parallel with transistor 24. The bases of transistors 23 and 24 are connected together so that their emitters are respectively coupled between the collectors of transistors 15 and 16. This connection provides a capacitance between the collectors of transistors 15 and 16 so that their potentials will ramp when they are switched.

When clock pulses are applied to terminal 13 transistors 15 and 16 are operated in the switching mode in which the tail current is alternated between them. Due to the presence of the capacitive transistors 22 and 24, the collector voltages of transistors 15 and 16 will ramp up and down as the capacitance is charged and discharged. The main requirement is that the voltage ramps be of a duration that exceeds the maximum phase shift that the circuit must achieve.

Emitter follower transistor 27 acts as a buffer with load resistor 28 to couple node 25 to comparator 29. The values of resistors 21 and 23 are selected to be about double the value of resistor 19 so that node 25 swings from $+V_{CC}$ down to about $2V_{BE}$ below $V_{CC}$. At the emitter of transistor 27 the downward swing will be to about $3V_{BE}$ below $V_{CC}$ and the upward swing to about $V_{BE}$ below $V_{CC}$.

Transistors 30 and 31 are connected differentially to make up comparator 29 with their tail current being supplied by transistor 32. Resistor 33 is chosen so that the comparator tail current is about the same as the tail current of ramp generator 14. Resistor 34 is selected to match resistor 33 so that the collector of transistor 31 will be at about $V_{BE}$ below $V_{CC}$ when on. Emitter follower transistor 35 acts as an output buffer with its emitter load resistor 36. Thus, terminal 12 will swing between $V_{BE}$ below $V_{CC}$ for a clock pulse high and $2V_{BE}$ below $V_{CC}$ for a clock pulse zero.

The base of transistor 31 is returned to node 37 which represents a programmable reference voltage level as will now be described. Transistor 38 sinks current out of node 37 and its conductor is determined by the resistance value of network 39. The heart of network 39 is resistor 40 which is nominally equal in value to resistor 57. Resistors 58–61, which act as the matching device, are identical to the resistors 41–44 and 45–48.

Resistor 40 can be paralleled with any one or all of resistors 41–48, each of which has a value of about ten times the value of resistor 40. When all of the resistors in network 39 are connected its resistance will be lower than the effective value of R57–R61 in parallel. Thus, depending upon its programming, network 39 will be either higher or lower in value than parallel resistors 57–61. Transistors 49–56 respectively connect resistors 41–48 into the circuit depending upon the level of the eight digital control lines. When the respective control line is high the transistor will be on and is designed so that its on resistance is negligible with respect to the resistor value. In the system disclosed here the lines I0–I3 are nominally low so that transistors 49–52 are normally off. Lines $\overline{D0}$–$\overline{D3}$ are nominally high so that transistors 53–56 are on and resistors 45–48 are connected in parallen with resistor 40. This parallel combination is approximately equal to the value of parallel resistors 57–61. Since the voltage across network 39 is close to $V_{BE}$ the potential across resistors 57–61 is also close to $V_{BE}$. The presence of diode 62 will bias node 37, at close to $2V_{BE}$ below $+V_{CC}$. As was shown above, the ramp input to the base of transistor 30 swings between one and three $V_{BE}$ below $V_{CC}$. Therefore, comparator 29 will switch at about the midpoint of the ramp signal for this reference level.

It can be seen that as lines I0–I3 act to switch transistors 49–52 on the reference potential at node 37 will be lowered in small increments. As lines $\overline{D0}$–$\overline{D3}$ act to switch transistors 53–56 off the potential at node 37 will rise proportionately in small increments. Thus, small but finite voltage increments at node 37 will result from the operation of the digital control lines. In the preferred embodiment of the invention the digital increments are chosen in relation to the ramp generator 14 ramp rate so that the phase shift increments in the circuit are about 0.2 nanoseconds (ns) and are equal. This gives a range of ±0.8 ns.

If desired, the resistor values in network 39 can be binarily weighted. This will extend the phase shift range, but will make the steps unequal or nonlinear.

Transistor 57 has its emitter and collector connected to node 37 and its base grounded. Thus, this transistor presents a capacitor to ground that acts to bypass transients at node 37.

Figure 2:
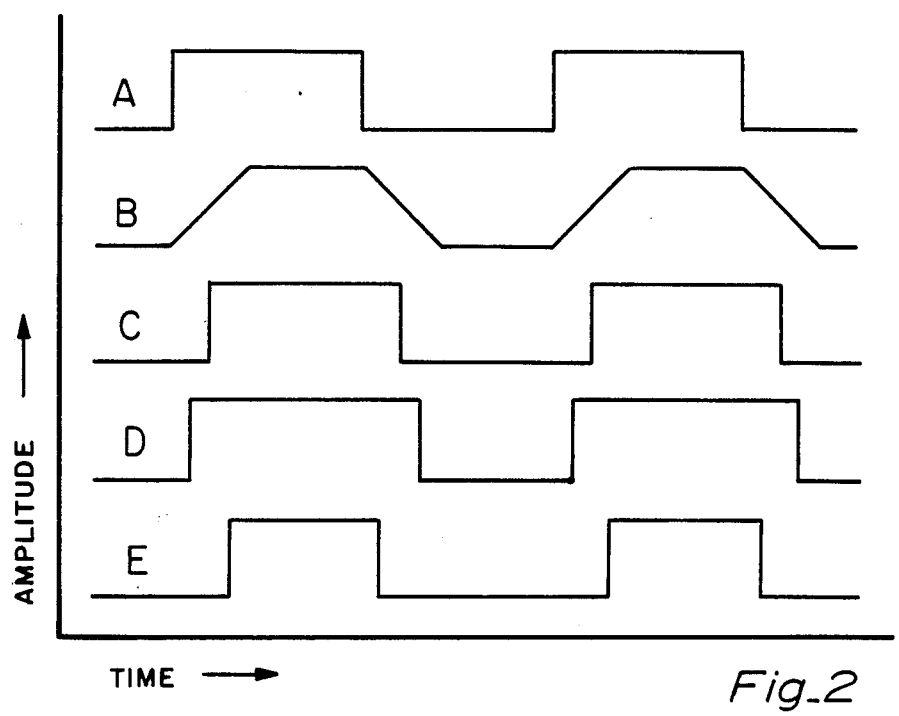
FIG. 2 is a graph showing the waveforms associated with the circuit of FIG. 1.

FIG. 2 is a graph showing the waveforms associated with the circuit of FIG. 1. These waveforms are not to scale and are presented to show the form of the signal and their temporal relationship to each other. Waveform A represents the clock pulses at terminal 13. Waveform B is the ramp signal at node 25. Waveform C is the clock pulse output at terminal 12 with the nominal phase shift. Waveform D is the clock pulse output with a increased phase shift. Waveform E is the clock pulse output with an reduced phase shift.

The condition for achieving waveform C is a nominal current in network 39 wherein transistors 49–52 are off and transistors 53–56 are on. Waveform D is achieved when one or more of transistors 49–52 are turned on thereby increasing the current in network 39. Waveform E is achieved when one or more of transistors 53–56 are turned off thereby reducing the current in network 39. It can be seen that the output duty cycle is close to 50% for the nominal conditions, but for the other delay conditions (waveforms D and E) the clock pulses are no longer at 50% duty cycle. In digital circuitry that operates on a pulse transition, or edge, this departure from 50% duty cycle is of no consequence. However, in some forms of circuitry this departure can be troublesome.

The circuits shown in FIGS. 3 and 4 act to correct this deficiency and to provide a 50% duty cycle for all delay conditions. FIG. 3 is a schematic diagram of a second comparator 63. It is coupled to an output terminal 64 by way of an emitter follower buffer transistor 65 which has a load resistor 66. The circuit is driven from node 26 of FIG. 1 via an emitter follower buffer transistor 67 with its load resistor 68. Comparator 63 is composed of differentially connected transistors 69 and 70 with their tail current being supplied by transistor 71. The hose of transistor 69 is returned to node 37, the programmable reference voltage of comparator 29. The base of transistor 71 is returned to terminal 18 of FIG. 1 and resistor 72 determines the tail current. Resistor 73 provides the output load element for transistor 69. These parts match the same elements of comparator 29 of FIG. 1. The only difference is that comparator 63 is driven with the complement of the drive to compartor 29.

FIG. 4 is a logic diagram showing a latch created from NAND gates 74 and 75. Gate 74 is driven from terminal 12 of FIG. 1 and gate 75 is driven from terminal 64 of FIG. 3. Because the comparators 29 and 63 are identical and having the complementary inputs, the phase drift achieved by one comparator's output is compensated by the same amount from the other comparator. The outputs passed through an R-S latch of FIG. 4 produces a 50% duty cycle clock pulse train at terminal 73.

Figure 5:
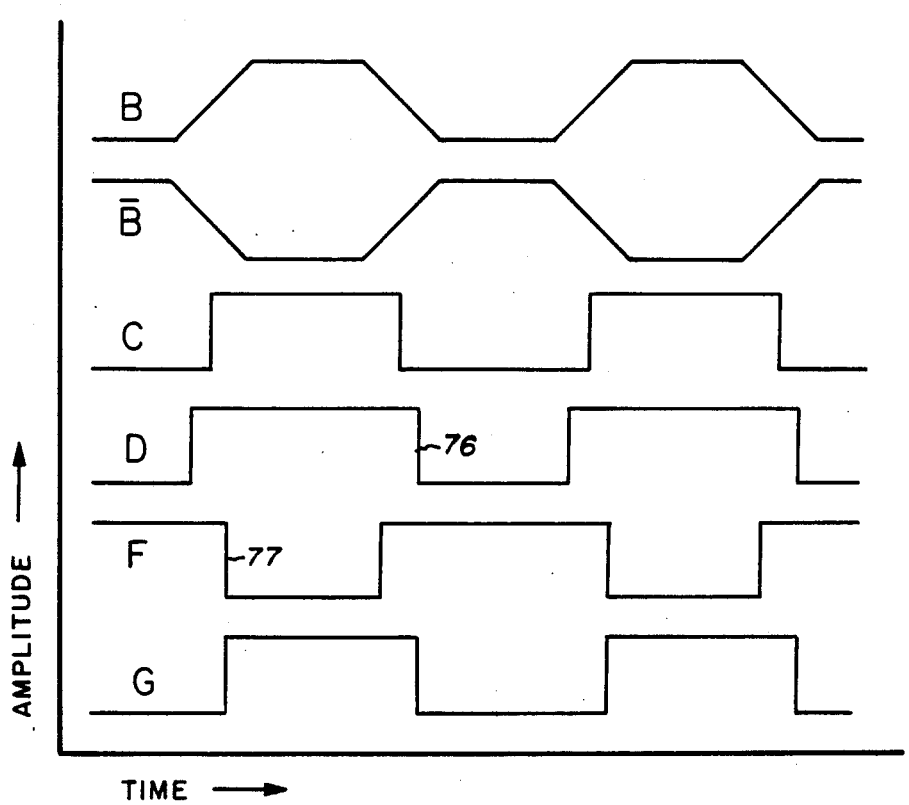
FIG. 5 is a graph showing the waveforms associated the circuts of FIGS. 1, 3 and 4 for a condition of a low $V_{REF}$.

FIG. 5 is a graph showing the waveforms associated with the use of the circuits in FIGS. 3 and 4, and shows the result of lowering the value of the comparator reference voltage. Waveform B represents the ramp signal at node 26. Waveforms D and F represent the signals applied to gates 74 and 75 respectively. Waveform G represents the output at terminal 73. It can be seen that as the comparator reference level departs from its nominal value, the output waveform remains at 50% duty cycle. This is due to the fact the downward transitions 77 and 76 actuate the NAND gates. These transitions each deviate from nominal in the same direction as the comparator reference is varied.

FIG. 6 is another graph showing the waveforms associated with the use of the circuits in FIGS. 3 and 4. Here the value of the comparator reference voltage is increased. Again, it can be seen that the output waveform I retains a 50% duty cycle as transitions 78 and 79 actuate NAND gates 74 and 75.

The invention has been described and the preferred embodiment detailed in bipolar transistor form. When a person skilled in the art reads the foregoing description, alternatives and equivalents within the spirit and intent of the invention will become apparent. For example, the circuit functions can be accomplished in substantially the same way using field effect transistors. Also, while field effect transistors are shown in the control of the resistor array 39, bipolar transistors could be employed. Accordingly, it is intended that the scope of the invention be limited only by the following claims.

I claim:

1. A programmable clock pulse phase shifter circuit comprising:
    integrator means having an input coupled to a source of input clock pulses and functioning to convert said input clock pulses to a ramp signal, said integrator means comprising a first pair of transistors each one having emitter, base and collector electrodes with the bases comprising said input and with the emitters connected together to force said first pair of transistors to operate differentially, a pair of load resistors coupled to the collectors thereof to act as output elements and capacitive means coupled between the collectors of said first pair of transistors;

comparator means having an input coupled to one of the collectors of said first pair of transistors thereby to receive said ramp signal and having a comparison reference voltage whereby said ramp signal is converted into output clock pulses having edges located where a voltage of said ramp signal is equal to said reference voltage; and means connected to said comparator for digitally programming said comparison reference voltage whereby said output clock pulse edges can be shifted in time by digital increments to create a variable clock pulse phase shift between said input clock pulses and said output clock pulses.

2. The circuit of claim 1 wherein said capacitive means comprise a second pair of transistors each one having emitter, base and collector electrodes and each having its emitter coupled to a collector of said first pair of differentially connected transistors, each having its base directly connected to the other, and each having its collector returned to a source of reference potential.

3. The circuit of claim 2 wherein said comparator means comprise a third pair of transistors each one having emitter, base and collector electrodes, means for connecting said third pair of transistors together so that they operate differentially and one of the collectors has a resistor load to provide said comparator output, means for coupling one of said output elements of said integrator means to one base of said third pair of transistors and means for coupling said comparison reference to the other base of said third pair of transistors.

4. The circuit of claim 3 wherein said means for digitally programming comprises a control resistor network which includes a nominal resistor and a plurality of parallel coupled shunting resistors each one of which has a series connected transistor switch coupled to and controlled by one of a plurality of digital control signal lines and wherein said plurality of shunting resistors is equal in number to the number of digital control signal lines.

5. The circuit of claim 4 wherein said shunting resistors have a value that is substantialy larger than the value of said nominal resistor.

6. The circuit of claim 1 further comprising means for developing a complementary ramp signal, complement comparison means having one input coupled to the means for developing a complementary ramp signal and having a second input coupled to said comparison reference whereby said complementary ramp signal is converted into clock pulse signals having edges located where said complementary ramp signal is equal to said reference voltage and latch means for combining the clock signals produced by said comparison means and said complement comparison means whereby said clock output pulses operate at 50% duty cycle when said means for digitally programming varies said comparison reference voltage.

* * * * *